United States Patent [19]

Eigeldinger et al.

[11] Patent Number: 4,998,292
[45] Date of Patent: Mar. 5, 1991

[54] PROGRAMMING METHOD AND/OR EQUIPMENT FOR AUDIO OR VIDEO APPLIANCES

[75] Inventors: Norbert Eigeldinger; Rainer Fechner, both of Villingen, Fed. Rep. of Germany

[73] Assignee: Deutsche Thomson-Brandt GmbH, Villingen-Schwenningen, Fed. Rep. of Germany

[21] Appl. No.: 247,655

[22] Filed: Sep. 22, 1988

[30] Foreign Application Priority Data

Sep. 30, 1987 [DE] Fed. Rep. of Germany ....... 3733015

[51] Int. Cl.$^5$ .............................................. H04B 1/16
[52] U.S. Cl. .................................... 455/186; 455/185; 358/191.1
[58] Field of Search ............... 455/185, 186, 151, 352, 455/353; 358/194.1, 191.1

[56] References Cited

U.S. PATENT DOCUMENTS 4,495,654  1/1985  Deiss ................................... 455/151
4,626,848 12/1986  Ehlers .............................. 358/194.1
4,755,883  7/1988  Uehira .............................. 358/194.1

FOREIGN PATENT DOCUMENTS 2625131 12/1977 Fed. Rep. of Germany .
2744057  4/1979 Fed. Rep. of Germany .
2053339A 2/1981 United Kingdom .

Primary Examiner—Gerard R. Strecker
Assistant Examiner—Edward Urban
Attorney, Agent, or Firm—Joseph S. Tripoli; Peter M. Emanuel

[57] ABSTRACT

The disclosed embodiment of the invention comprises method and/or equipment to program a video or audio appliance, such as a video recorder, with tuning data such as the channel number, frequency or the like, required to receive television and/or radio transmissions, whereby the tuning data specific to a station can be entered into a program memroy of the video or audio appliance and be assigned to a program number or other program identification indicia. The tuning data and its assignment to a program number or other program identification are loaded automatically from a program memory of an already programmed video or audio appliance, such as a television set. In addition, apparatus is included for automatically loading the current time, for example, from videotext decoder unit. An advantage of the disclosed method and equipment is that the user is given a simple means of programming video or audio appliances with the tuning data required to receive television and/or radio broadcasts and/or the current time.

35 Claims, 1 Drawing Sheet

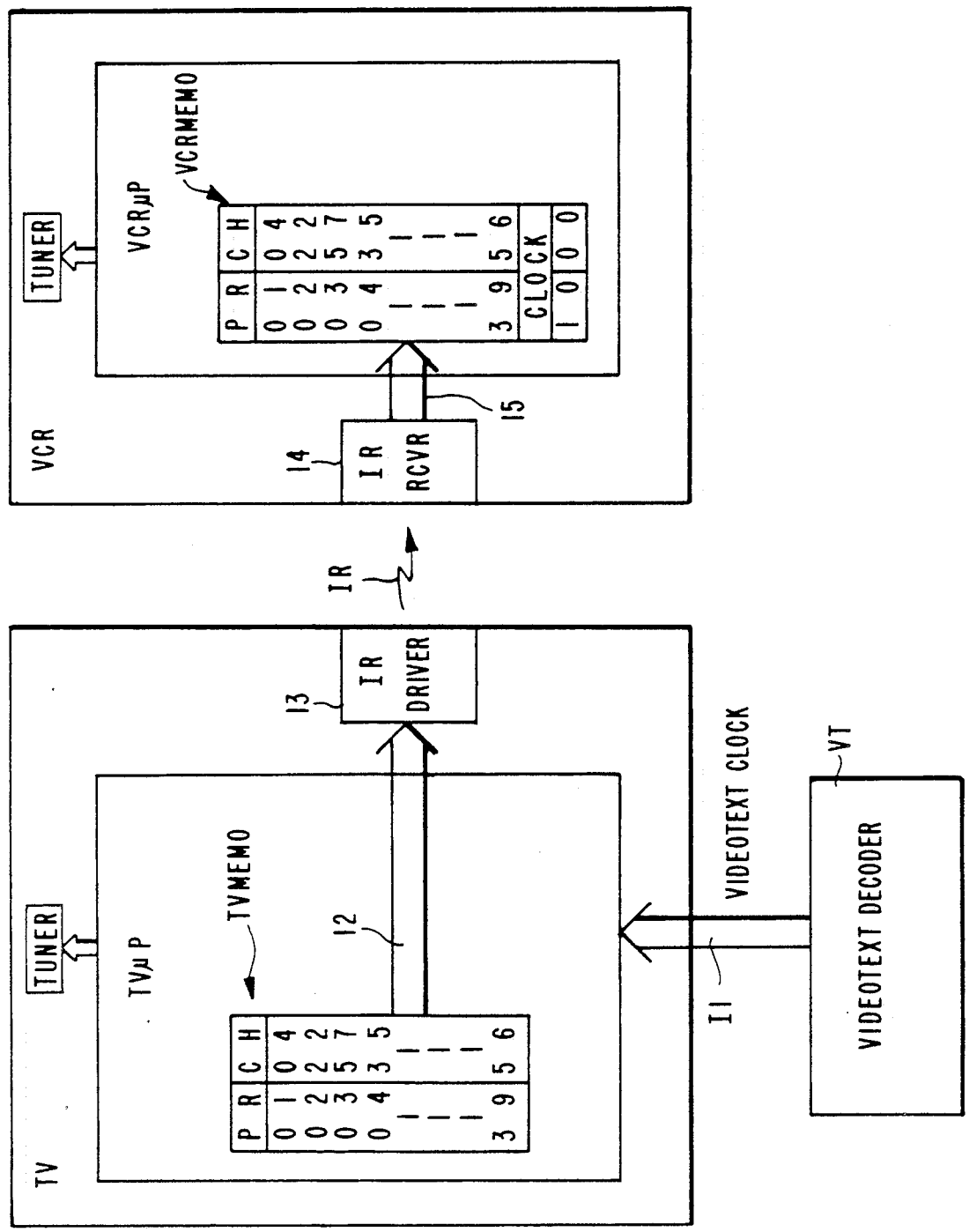

4,998,292

PROGRAMMING METHOD AND/OR EQUIPMENT FOR AUDIO OR VIDEO APPLIANCES

FIELD OF THE INVENTION

The invention concerns a method and/or equipment for programming an audio or video appliance.

BACKGROUND OF THE INVENTION

Methods and equipment for programming audio and video appliances are known, particularly in the video recorder field. Usually when a recorder is first connected to an existing video system, individual program numbers or other program identification indicia are assigned to respective tuning data, for example, the specific frequencies or channel numbers, required to receive transmissions from stations which are receivable at that locality. The tuning data is stored in a so-called program memory. The recorder is then "programmed" with certain basic data. Thereafter, if it is desired to set the tuner of the recorder to receive a certain station, the user need not enter the corresponding transmission frequency or channel number. Rather, it suffices to enter the program number assigned. Via the program memory, the recorder then determines the transmission frequency or channel number belonging to the desired program and adjusts the tuner accordingly.

In the methods and equipment known, however, a disadvantage is apparent in that entering the channel numbers or frequencies and their assignments to respective program numbers is time consuming and can be a source of errors.

A source of additional control errors also arises if the individual components of an audio/video home entertainment component system including, for example, radio and television receivers and recorders, have different assignments of frequencies or channel numbers to program numbers.

Thus, there is a desire to provide users with a simple means of programming audio and video appliances with required tuning data for receiving radio and television broadcasts.

SUMMARY OF THE INVENTION

In accordance with the invention, the tuning data and its assignment to a program number or other program identification indicia is automatically loaded into the program memory of a new audio or video appliance of a component system from the program memory of a previously programmed audio or video appliance of the system. This has the advantage that the appliance to be programmed, for example, the video recorder, is automatically programmed and no additional steps have to be taken and reduces the possibility of programming errors.

In an exemplary embodiment of the invention to be described in detail below, an existing television set has already been manually programmed. With the subsequent installation of a video recorder, the tuning data and its assignment to a program number previously stored in the program memory of the television set is automatically transferred and loaded into the program memory of the video recorder.

Further, as will be described with reference to the exemplary embodiment, if a videotext decoder is coupled to the television set, the current time received by the videotext decoder may also be transmitted to an appliance to be programmed, for example, the video recorder, in order to reset that unit's internal clock to the current time.

The data transfer is preferentially performed via an infrared transmission link. For example, the transfer of the data may be achieved by utilizing the remote control transmission systems already utilized by the audio or video appliances of the component system. Thus, for example, the data required for programming can be coupled in a suitable manner to an infrared transmission unit built into the previously programmed appliance such as a television set and thereby to the infrared receiver unit of the remote control system which is built into the appliance to be programmed such as a video recorder. In other words, the appliance to be programmed is programmed by simulating a manually activated transmission from the unit's corresponding infrared remote control transmission unit to the unit's infrared receiving unit.

In connection with the latter, when undertaking the initial programming or renewed programming of an appliance, the user is requested by a control unit associated with the infrared transmission unit of the previously programmed appliance to enter the type of audio or video appliances to be automatically programmed in order to select the appropriate transmission code. In the case where the appliance to be programmed manually is a television set, a choice menu can be caused to be displayed on the screen of the television set by which the user can select the appliance to be programmed, for example, using a cursor. A memory, in which the assignments of individual types of audio and video appliances to respective remote control transmission codes is stored, is used by the infrared transmission unit to generate the required transmission code.

BRIEF DESCRIPTION OF THE DRAWING

Further features of the invention offering additional advantages are described below with respect to the preferred embodiment of the invention illustrated in the sole FIGURE which comprises a block diagram.

DETAILED DESCRIPTION OF THE DRAWING

In the FIGURE, a first microprocessor (TV$\mu$P) associated with a television set (TV) transmits data via a data path, preferentially an infrared link (IR), to a second microprocessor (VCR$\mu$P) belonging to a video recorder (VCR).

The first and the second microprocessors (TV$\mu$P and VCR$\mu$P) include respective so-called program memories (TVMEMO and VCRMEMO) into which for each of a plurality of program numbers (PR) a certain channel (CH) may be entered. An associated tuner (TUNER) of the television set is caused to tune the channel corresponding to a program number (PR) when the program number (PR) is selected via a user input keyboard (not illustrated). For example, when program number (PR) 01 is selected, the tuner is caused to tune channel (CH) 04, for program number (PR) 02, channel number 22; for program number 03, channel number 57; etc. The program numbers and the respective channel numbers are manually entered into the program memory (TVMEMO) of the television set by means of the user input keyboard (not illustrated) associated with the television receiver in customary fashion. The program numbers and the respective channel numbers stored in the program memory of the television set (TVMEMO) are automatically transferred and stored in the program memory of the video recorder (VCRMEMO), in accordance with the invention, as will be described below. An associated tuner (not illustrated) of the video recorder is caused to tune the channel corresponding to a program number (PR) when the program number (PR) is selected via a user input keyboard (not illustrated) associated with the video recorder. Since the contents of the respective program memories (TVMEMO and VCRMEMO) of the television set and video recorder are the same, as is illustrated, selecting a program number for either unit will cause the same channel to be tuned.

The program memory (VCRMEMO) of the video recorder also includes memory location (CLOCK) reserved for the current time.

A videotext decoder unit (VT), which in the embodiment illustrated, decodes signals received in order to display information including the current time (for example, in the form of 10:00) is coupled to the first microprocessor (TVμP) of the television set via a so-called I²C-Bus (11). The current time information, designated as "videotext clock" in the FIGURE, is transferred to the first microprocessor (TVμP) via the I²C-Bus (11). From the first microprocessor (TVμP) the current time is sent over the infrared link (IR) to the second microprocessor (VCRμP) in whose program memory (VCRMEMO) the time data is stored in a respective storage location (CLOCK) and is thereby then available for resetting an electronic clock (not illustrated) of the video recorder (VCR).

A data path (12) is schematically shown starting from the program memory (TVMEMO) of the first microprocessor (TVμP) and leading to the output of infrared link (IR). Data read from the program memory (TVμP) is transferred along this data path (12), comprising, for example, a signal line, coupled to a driver transistor (not illustrated) for an infrared transmitting diode (not illustrated) of an infrared transmitting unit (13). The transmitted signals are received at the other end of the infrared transmission link (IR) by an infrared receiving unit (14) and passed on from there to the program memory (VCRMEMO) of the video recorder through another data path (15).

In the exemplary embodiment, the IR link utilizes the existing remote control apparatus (i.e., the infrared receiver) of the video recorder (VCR). It is assumed that the remote control code for the video recorder (VCR) has been stored, ready for use, in the read-only memory (not illustrated) of the microprocessor (TVμP) of the television receiver.

The selection of the remote control code appropriate for the remote control apparatus of the video recorder (VCR) and other applications to be programmed automatically made by the user at installation. In connection with this aspect, for example, an on-screen display menu may be utilized to facilitate choosing the appropriate remote control codes for various appliances to be programmed automatically. When undertaking the initial programming or renewed programming of an appliance, a choice menu can be caused to be displayed on the screen of the television set by which the user is requested to select the appropriate remote control code by using, for example, a cursor, to select the appliance to be automatically programmed. A memory in which the assignment of individual types of audio or video appliances to respective remote control transmission codes is stored, is used by the infrared transmission unit to generate the required transmission code.

After the manual programming of the television set, via an internal sequence control of the first microprocessor (TVμP), its program memory (TVMEMO) is caused to be automatically read and the current time supplied by the videotext decoder (VT) is interrogated via the I²C-Bus (11) and all of this data is transmitted via the infrared transmission link (IR), in error-free fashion, to storage locations of the program memory (VCRMEMO) of the video recorder (VCR). Thus, the same assignment of program number to tuning channel is stored in the program memory (VCRMEMO) of the video recorder (VCR) as is stored in the program memory (TVMEMO) television set and the internal clock (not illustrated) of the video recorder is reset.

The matching of program number assignments is not only of advantage to the less technically minded consumer users in providing easier control, but also for example, commercial users employing such appliances on a professional basis can benefit. For example, at exhibitions, fairs and similar events, if it is necessary to program a large number of appliances then it is sufficient for one of the appliances to be programmed, according to the invention. When this single unit has been programmed manually, then the other units can be automatically programmed using the manner described whereby (assuming sufficient transmission power for the infrared transmission unit and a suitable transmission code) all other units can be automatically programmed in one step.

While the invention has been described in terms of a preferred embodiment, modifications are contemplated. For example, while the transfer of data in the exemplary embodiment is by means of a wireless infrared link (IR), it could as well be by means of a wired link. Further, while program numbers and channel numbers are utilized, other program identification indicia and other tuning data, such as frequencies, may also be utilized. These and other features of the invention are intended to be within the scope of the invention defined by the following claims.

What is claimed is:

1. A method for programming an audio or video appliance, with tuning data, required to control a tuner included within the appliance to receive radio or television transmissions, respectively, whereby the tuning data specific to a station is assigned to program identification indicia, and entered into a program memory of the audio or video appliance, comprising the step of:
   loading the tuning data and its assignments to various program identification indicia from another program memory of a previously programmed audio or video appliance, which also includes a respective tuner controllable in accordance with the tuning data, so that said two program memories of said two appliances are programmed with the same tuning data for controlling respective ones of said two tuners to receive the same transmissions for the same program identification indicia.

2. The method according to claim 1, wherein the loading step including the sub-steps of:
   reading the tuning data and its assignments to various program identification indicia from the program memory of the previously programmed appliance;
   transferring the read tuning data and its assignments to various program identification indicia via one of wire or wireless means from the previously programmed appliance to the appliance to be programmed; and then storing the transmitted tuning data and its assignments to various program identification indicia in another program memory of the appliance to be programmed.

3. The method according to claim 2, wherein: the read tuning data and its assignments to various program identification indicia is transferred using an infrared transmission link.

4. The method and/or equipment according to claim 3, wherein:
said tuning data and its assignments to various program identification indicia is transferred to the program memory of the previously programmed appliance utilizing a transmission code which is the same code as that used for a remote control device of the appliance to be programmed.

5. The method according to claim 3, wherein:
the appliance to be programmed is automatically programmed with the tuning data and its assignment to various program identification indicia contained in the program memory of the previously programmed appliance when said previously programmed appliance is manually programmed.

6. The method according to claim 3, wherein:
in addition to the information concerning the tuning data and its assignment to the various program identification indicia, the current time is transmitted to the appliance to be programmed and is used to set an internal clock of that appliance.

7. The method and/or equipment according to claim 2, wherein:
said tuning data and its assignments to various program identification indicia is transferred to the program memory of the previously programmed appliance utilizing a transmission code which is the same code as that used for a remote control device of the appliance to be programmed.

8. The method according to claim 2, wherein:
the appliance to be programmed is automatically programmed with the tuning data and its assignment to various program identification indicia contained in the program memory of the previously programmed appliance when said previously programmed appliance is manually programmed.

9. The method according to claim 2, wherein:
in addition to the information concerning the tuning data and its assignment to the various program identification indicia, the current time is transmitted to the appliance to be programmed and is used to set an internal clock of that appliance.

10. The method according to claim 1, wherein:
said tuning data and its assignments to various program identification indicia is transferred to the program memory of the previously programmed appliance utilizing a transmission code which is the same code as that used for a remote control device of the appliance to be programmed.

11. The method according to claim 4, wherein:
the appliance to be programmed is automatically programmed with the tuning data and its assignment to various program identification indicia contained in the program memory of the previously programmed appliance when said previously programmed appliance is manually programmed.

12. The method according to claim 10, wherein:
in addition to the information concerning the tuning data and its assignment to the various program identification indicia, the current time is transmitted to the appliance to be programmed and is used to set an internal clock of that appliance.

13. The method according to claim 1, wherein:
the appliance to be programmed is automatically programmed with the tuning data and its assignment to various program identification indicia contained in the program memory of the previously programmed appliance when said previously programmed appliance is manually programmed.

14. The method according to claim 13, wherein:
in addition to the information concerning the tuning data and its assignment to the various program numbers or identifications the current time is transmitted to the appliances to be programmed and is used to set the internal clock of that appliance.

15. The method according to claim 1, wherein:
in addition to the information concerning the tuning data and its assignment to the various program identification indicia, the current time is transmitted to the appliance to be programmed and is used to set an internal clock of that appliance.

16. The method according to claim 11, wherein:
the current time is received from a videotext decoder.

17. The method recited in claim 1, further including the step of:
selecting a transmission code for transferring said tuning data from a plurality of different transmission codes appropriate for controlling respective ones of a plurality of different audio or video appliances.

18. In a component system, apparatus comprising:
a first component including a first memory associated with a first tuner and storing tuning data for controlling said first tuner to receive transmissions associated with stations assigned to respective program identification indicia; and manual means for manually entering said tuning data into said first memory; and
a second component including a second memory associated with a second tuner;
said first component further including control means for reading said tuning data stored in said first memory; and transferring means for transferring said tuning data read from said first memory to said second memory under the control of said control means so that said first and second memories of said first and second components are programmed with the same tuning data for controlling respective ones of said tuners to receive the same transmissions for the same program identification indicia.

19. The component system according to claim 18, wherein:
said transferring means include an infrared link.

20. The component system according to claim 19, wherein:
said second component includes a remote control unit; and
said tuning data is transferred to said second component utilizing a transmission code which is the same as that used for said remote control unit of said second component.

21. The component system according to claim 20, wherein:
said control means causes said tuning data to be automatically transferred from said first memory of said first component to said second memory of said second component when said first memory of said first component is programmed with said tuning data and said respective program identification indicia is manually entered into said first memory utilizing said manual means.

22. The component system according to claim 20, further including a source of time keeping data and wherein:
said transferring means is coupled to said time keeping data source and transfers said time keeping data to an internal clock of said second component under the control of said control means.

23. The component system according to claim 19, further including a source of time keeping data and wherein:
said transferring means is coupled to said time keeping data source and transfers said time keeping data to an internal clock of said second component under the control of said control means.

24. The component system according to claim 18, wherein:
said second component includes a remote control unit; and
said tuning data is transferred to said second component utilizing a transmission code which is the same as that used for said remote control unit for said second component.

25. The component system according to claim 18, wherein:
said control means causes said tuning data to be automatically transferred from said first memory of said first component to said second memory of said second component when said first memory of said first component is programmed with said tuning data and said respective program identification indicia is manually entered into said first memory utilizing said manual means.

26. The component system according to claim 25, further including a source of time keeping data and wherein:
said transferring means is coupled to said time keeping data source and transfers said time keeping data to an internal clock of said second component under the control of said control means.

27. The component system according to claim 18, wherein:
said control means causes said tuning data to be automatically transferred from said first memory of said first component to said second memory of said second component when said first memory of said first component is programmed with said tuning data and said respective program identification indicia is manually entered into said first memory utilizing said manual means.

28. The component system according to claim 18, further including a source of time keeping data and wherein:
said transferring means is coupled to said time keeping data source and transfers said time keeping data to an internal clock of said second component under the control of said control means.

29. The component system according to claim 28, wherein:
said time keeping data source is a videotext decoder.

30. The apparatus recited in claim 18, wherein:
said control means includes means for selecting a transmission code for transferring said tuning data from said first memory to said second memory from a plurality of transmission codes appropriate for controlling respective ones of a plurality of different second components.

31. For use in a system including a first memory associated with a first tuner and storing tuning data for controlling said first tuner to receive transmissions associated with stations assigned to respective program identification indicia; manual means for entering said tuning data into said first memory; and a second component with a second memory associated with a second tuner; apparatus comprising:
control means for reading said tuning data stored in said first tuning memory; and
transferring means for transferring said tuning data read from said first tuning memory to said second tuning memory under the control of said control means so that said first and second memories of said first and second components are programmed with the same tuning data for controlling respective ones of said tuners to receive the same transmissions for the same program identification indicia.

32. The combination recited in claim 31, wherein:
said first component is a television set and said second component is a video recorder.

33. The apparatus recited in claim 32, wherein:
said television set includes display means for displaying a menu for selecting a transmission code for transferring said tuning data from said first memory to said second memory from a plurality of transmission codes corresponding to respective ones of a plurality of different second components.

34. The apparatus recited in claim 31, wherein:
said control means includes means for selecting a transmission code for transferring said tuning data from said first memory to said second memory from a plurality of transmission codes appropriate for controlling respective ones of a plurality of different second components.

35. For use in a system including a first memory associated with a first tuner and storing tuning data for controlling said first tuner to receive transmissions associated with stations assigned to respective positions within a program list; manual means for manually programming said first tuning memory with said tuning data; and a second component with a second memory associated with a second tuner; apparatus comprising:
control means for reading said tuning data stored in said first tuning memory; and
transferring means for transferring said tuning data read from said first tuning memory to said second tuning memory under the control of said control means so that said first and second memories of said first and second components are programmed with respective program lists in which the same stations are assigned to the same respective positions.

* * * * *